US006261428B1

United States Patent
Nozawa et al.

(10) Patent No.: US 6,261,428 B1
(45) Date of Patent: Jul. 17, 2001

(54) MAGNETRON PLASMA PROCESS APPARATUS

(75) Inventors: Toshihisa Nozawa; Keiji Horioka; Isahiro Hasegawa, all of Tokyo (JP)

(73) Assignees: Tokyo Electron Limited, Tokyo; Kabushiki Kaisha Toshiba, Kawasaki, both of (JP)

( * ) Notice: Subject to any disclaimer, the term of this patent is extended or adjusted under 35 U.S.C. 154(b) by 0 days.

(21) Appl. No.: 08/183,787

(22) Filed: Jan. 21, 1994

Related U.S. Application Data

(63) Continuation of application No. 07/932,934, filed on Aug. 20, 1992, now abandoned.

(30) Foreign Application Priority Data

Aug. 20, 1991 (JP) .................................................. 3-234060

(51) Int. Cl.[7] .................................................. C23C 14/34
(52) U.S. Cl. ............................... 204/298.37; 204/298.35; 156/345
(58) Field of Search .................. 204/298.35, 298.37, 204/192.32; 156/345

(56) References Cited

U.S. PATENT DOCUMENTS

| | | | |
|---|---|---|---|
| 4,422,896 | * 12/1983 | Class et al. ................. | 204/298.37 X |
| 4,631,106 | * 12/1986 | Nakazato et al. ........... | 204/298.37 X |
| 4,816,638 | * 3/1989 | Uhai et al. ................... | 204/298.35 X |
| 4,829,215 | * 5/1989 | Kim et al. .................... | 204/298.37 X |
| 4,838,978 | * 6/1989 | Sekine et al. ................ | 204/298.35 X |
| 4,842,707 | * 6/1989 | Kinoshita et al. ............. | 204/298.37 |

FOREIGN PATENT DOCUMENTS

| | | | |
|---|---|---|---|
| 59-27212 | 7/1984 | (JP) . | |
| 144133 | * 8/1984 | (JP) ............................... | 204/298.37 |
| 60-58794 | 12/1985 | (JP) . | |
| 187336 | * 8/1986 | (JP) ............................... | 204/298.37 |
| 63-48952 | 10/1988 | (JP) . | |

* cited by examiner

Primary Examiner—Nam Nguyen
(74) Attorney, Agent, or Firm—Oblon, Spivak, McClelland, Maier & Neustadt, P.C.

(57) ABSTRACT

A magnetron plasma process apparatus comprises a process chamber, an upper electrode and a lower electrode, both located within the process chamber and extending parallel to each other, a gas-supplying system for supplying a process gas into the space between the electrodes, a high-frequency power supply for generating an electric field, to thereby to form plasma from the process gas, and magnetic field generating section for generating a magnetic field which extends through the space between the electrodes. The magnetic field generating section has a pair of permanent magnets located outside the process chamber, sandwiching the space between the electrodes. The magnetic field generated by this section extends through said space, from one of the magnets to the other thereof and substantially parallel to the electrodes, and serves to achieve magnetron plasma process on an object placed on the lower electrode.

3 Claims, 6 Drawing Sheets

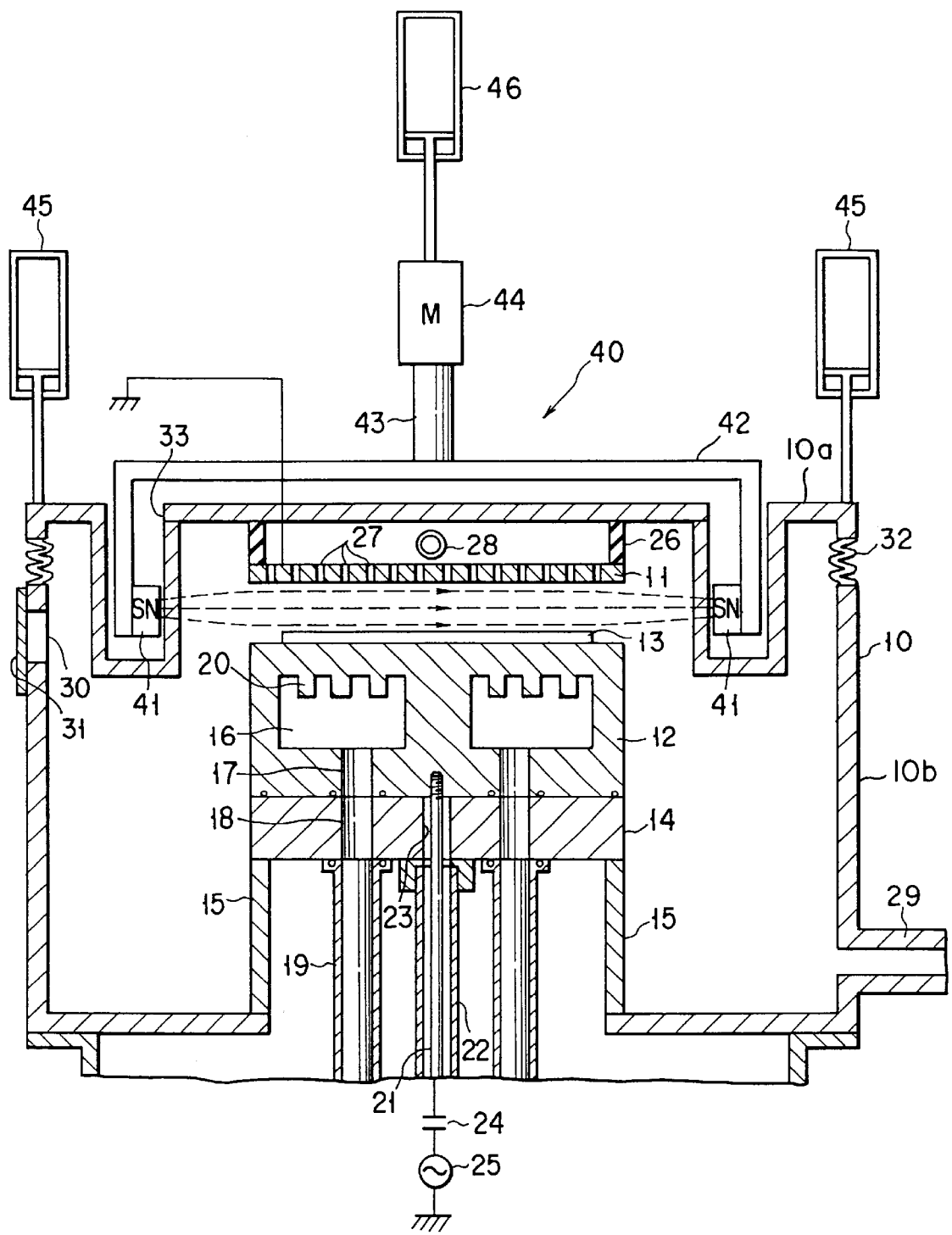
F I G. 2

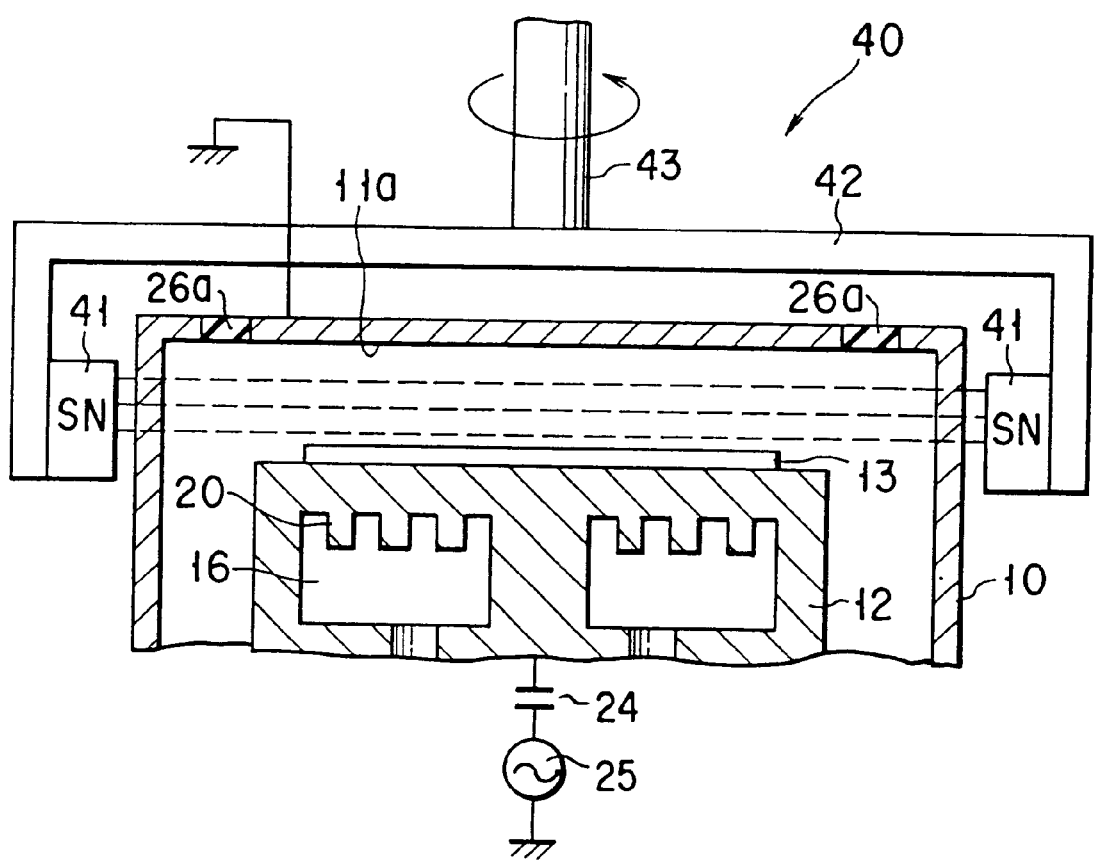
F I G. 6

MAGNETRON PLASMA PROCESS APPARATUS

This application is a Continuation of application Ser. No. 07/932,934 filed on Aug. 20, 1992, now abandoned.

BACKGROUND OF THE INVENTION

1. Field of the Invention

The present invention relates to a magnetron plasma process apparatus for use in manufacturing semiconductor devices or the like.

2. Description of the Related Art

Hitherto known as magnetron plasma process apparatuses are, for example, a dry etching apparatus and a thin-film forming apparatus. In a magnetron plasma process apparatus of this type, magnetron plasma is generated in the reaction chamber, and the radicals, electrons, ions, or the like existing in the plasma are utilized to achieve a desired process such as etching or forming of a thin film.

A magnetron plasma etching apparatus, one type of such a magnetron plasma process apparatus, will be described. As is shown in FIG. 1, the etching apparatus has a process chamber 2, i.e., a reaction chamber. The chamber 2 has an inlet port and an outlet port. Etching gas can be introduced into the chamber 2 via the inlet port and can be exhausted from the chamber 2 through the outlet port. A lower electrode 4 is located within the chamber 2. Placed on this electrode 4 is a semi-conductor wafer 3 which is the object to be processed with plasma. The lower electrode 4 is electrically connected to a high-frequency power supply 5 which is located outside the process chamber 2. The top wall of the process chamber 2 functions as upper electrode 6, which is connected to the ground. The lower electrode 4 and the upper electrode 6 form a pair of parallel flat electrodes.

In operation, etching gas is introduced into the process chamber 2 via the inlet port, and the high-frequency power supply 5 supplies a high-frequency power of 380 KHz or 13.56 MHz between the electrodes 4 and 6. Plasma of the etching gas is thereby generated in the space between the electrodes 4 and 6, by means of cathode coupling (RIE). The ions or radicals in the plasma react with the silicon compound in the wafer 3, thereby etching the semiconductor wafer 3.

Permanent magnets 7 are located above the process chamber 2. These magnets 7 are secured to a support 8, which is connected to a shaft 9. The shaft 9 is rotated by an electric motor (not shown), thereby rotating the permanent magnets 7 around the axis of the shaft 9. As a result, a magnetic field indicated by the broken lines in FIG. 1 is generated between the lower electrode 4 and the upper electrode 6. The horizontal component of this magnetic field extends at right angles to the electric field generated between the electrodes 4 and 6, composing a closed electromagnetic field. Due to the closed electromagnetic field, electrons assume cycloidal motion. Hence, the electrons colloid with the molecules of the etching gas at elevated frequency, generating more and more plasma. This increases the etching speed of the wafer 3.

The conventional plasma etching apparatus, described above, has drawbacks, however.

The magnetic field the magnets 7 apply has not only a horizontal component but also a considerably prominent vertical component, as can be understood from FIG. 1. The magnitude of this vertical component differs in accordance with the position in the surface of the semi-conductor wafer 3. Therefore, the self bias ($V_{DC}$) applied on a portion of the wafer 3 is different from the self bias applied on another portion thereof. Any portion of the wafer 3 that is applied with an excessive self will be charged excessively. The gate oxide film formed on this portion of the wafer 3 is broken in some cases.

Further, since in the conventional plasma etching apparatus the magnets are provided above the chamber 2, the magnetic field generated by the magnets 7 may leak to the components other than the process chamber 2, such as sensors each having a permanent magnet, inevitably causing malfunction of the sensors. If an apparatus in which electron beams are used is arranged besides the magnetron etching apparatus, it will be adversely influenced by the leakage magnetic field leaking from the plasma etching apparatus.

These drawbacks are inherent in not only a magnetron plasma etching apparatus, but also in a plasma sputtering apparatus and a plasma CVD apparatus, which uses magnetron plasma.

SUMMARY OF THE INVENTION

One object of the present invention is to provide a magnetron plasma process apparatus which can uniformly process the entire surface of an object, practically not adversely influenced by the vertical component of a magnetic field.

Another object of the invention is to provide a magnetron plasma process apparatus which prevents the adverse influence caused by the leakage magnetic field generated by magnets.

According to the present invention, there is provided a magnetron plasma process apparatus comprising: a process chamber; a pair of electrodes located within the process chamber and parallel to each other; holder means for holding an object to be processed between the electrodes and parallel thereto; gas-supplying means for supplying a process gas into the space between the electrodes; and magnetic field generating means having a pair of permanent magnets located outside the process chamber, sandwiching the space between the electrodes, for generating a magnetic field which extends through the space between the electrodes, from one of the magnets to the other thereof and substantially parallel to the electrodes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a cross-sectional view showing a magnetron plasma etching apparatus according to a first embodiment of the present invention;

FIG. 6 is a cross-sectional view of a magnetron plasma etching apparatus according to a third embodiment of the invention.

DETAILED DESCRIPTION OF THE PREFERRED EMBODIMENTS

Figure 1:
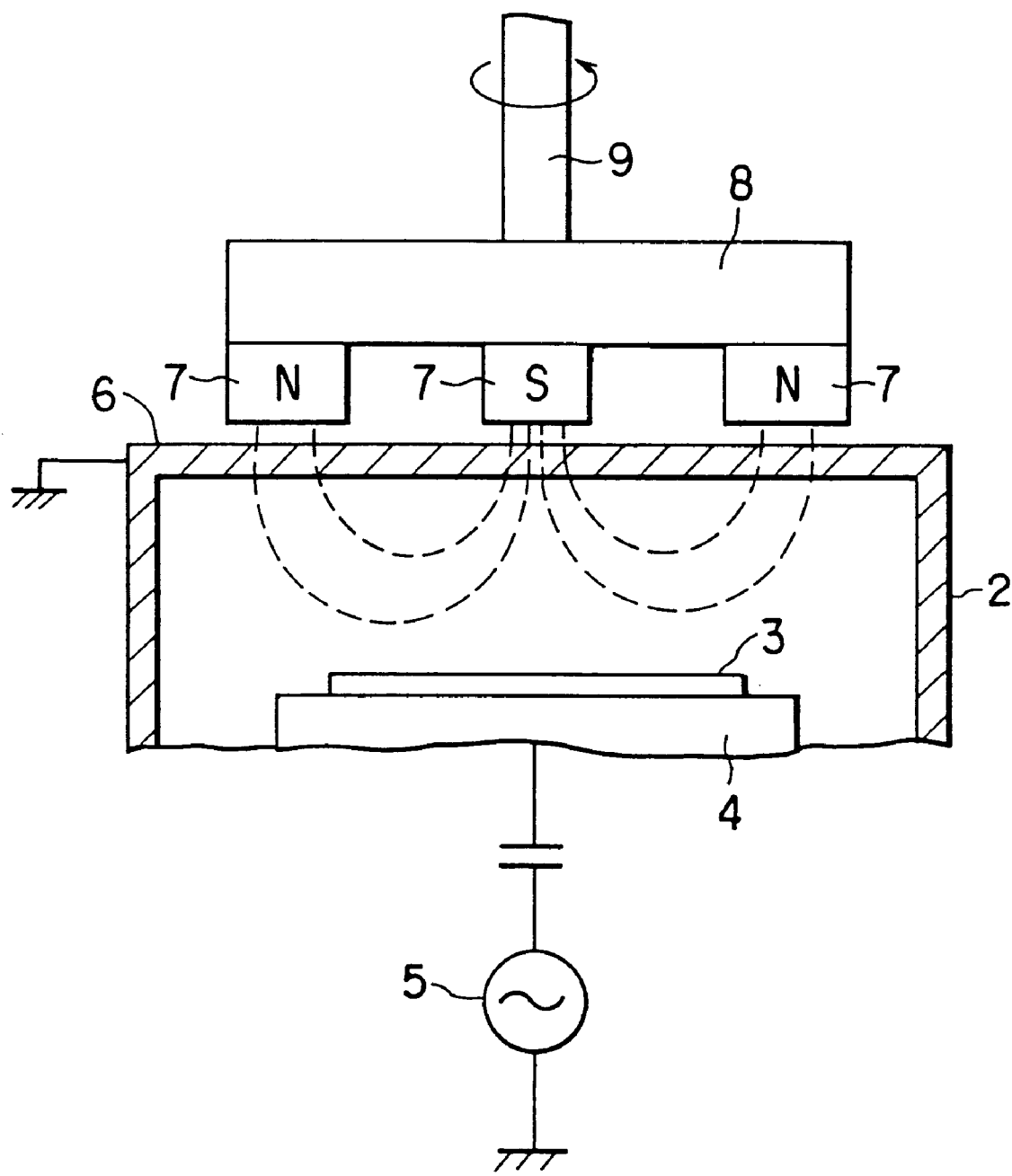
FIG. 1 is a cross-sectional view of a conventional magnetron plasma etching apparatus.

Magnetron plasma etching apparatuses, which are embodiments of the invention, will now be described in detail, with reference to the accompanying drawings.

FIG. 2 shows the magnetron plasma etching apparatus according to a first embodiment of this invention. As is shown in this figure, the apparatus comprises a cylindrical process chamber 10. The chamber 10 is composed of an upper part 10a, a lower part 10b, and bellows 32 coupling the parts 10a and 10b together. Both parts 10a and 10b made of, for example, aluminum, and their surfaces are anodically oxidized.

Arranged in the chamber 10 are an upper electrode 11 and a lower electrode 12. The upper electrode 11 is located above the lower electrode 12 and substantially parallel thereto. Both electrodes 11 and 12 are made of, for example, carbon or aluminum. In case they are made of aluminum, their surfaces are anodically oxidized.

Placed on the lower electrode 12 is a semiconductor wafer 13 which is to be plasma-etched. The wafer 13 is secured to the lower electrode 12 by a proper fastening means (not shown). The fastening means is, for example, an electrostatic chuck which applies a Coulomb force on the wafer 13, to thereby to hold the semiconductor wafer 13.

Attached to the lower surface of the lower electrode 12 is a heat insulating member 14, with a sealing member clamped between the electrode 12 and the heat insulating member 14. The member 14 is made of ceramics or the like material. A hollow cylindrical support 15 is connected at its upper end to the lower surface of the heat insulator 14, and at its lower end to the bottom of the process chamber 10.

Formed within the lower electrode 12 is an annular coolant chamber 16. The chamber 16 is connected to two vertical coolant passages 17 made in the lower electrode 12. The passages 17 communicate with the two vertical coolant passages 18 made in the heat insulating member 14, respectively. The passages 18 communicate with two coolant pipes 19, respectively. The pipes 19 are made of, for example, alumina. Coolant at a predetermined temperature is supplied into the coolant chamber 16 thorough the pipes 19, the passages 18, and the passages 17. Hence, the coolant circulates in the coolant chamber 16 to control the temperature of the wafer 13 mounted on the lower electrode 12. Fins 20 protrude downwards from the top of the coolant chamber 16, for promoting the heat exchange between the lower electrode 12 and the coolant.

An electrode rod 21 is set in screw engagement with the center portion of the lower electrode 12 and extends downwardly from the lower electrode 12 through a hole 23 made in the heat insulating member 14. A capacitor 24 and a high-frequency power supply 25 are connected in series to the electrode rod 21. The lower end portion of the rod 21 is surrounded by a protective tube 22.

The upper electrode 11 opposes the lower electrode 12 and is connected to the ground. It is supported by a hollow cylindrical electric insulator 26 made of insulative material such as ceramics, thereby electrically insulate from the cylindrical process chamber 10. The upper electrode 11 has a plurality of gas inlet ports 27. Process gas (i.e., etching gas) is supplied from a gas source (not shown) through a gas-supplying port 28 and is introduced into the chamber 10 through the gas inlet holes 27.

The upper electrode 11 and the lower electrode 12 function as parallel electrodes, the latter being connected to the radio-frequency (RF) power supply 25. Radio-frequency power is supplied from the power supply 25 to the lower electrode 12, whereby the upper electrode 11 and the lower electrode 12 function as a cathode and an anode, respectively, to accomplish RIE etching. The electrodes 11 and 12 are spaced apart by 25 to 30 mm to achieve the etching.

An exhaust pipe 29 is connected at one end to the lower portion of the side of the lower part 10b of the chamber 10, and at the other end to a vacuum pump (not show). When the vacuum pump is driven, the gas is exhausted from the chamber 10 through the exhaust pipe 29. A gate 30 is made in the upper portion of the side of the lower part 10b. A shutter 31 is slidably mounted on the side of the lower part 10b, closing the gate 30. When the shutter 31 is moved downwards, the gate 30 is opened so that a semiconductor wafer 13 can be inserted into the chamber 10 and removed therefrom.

Figure 3:
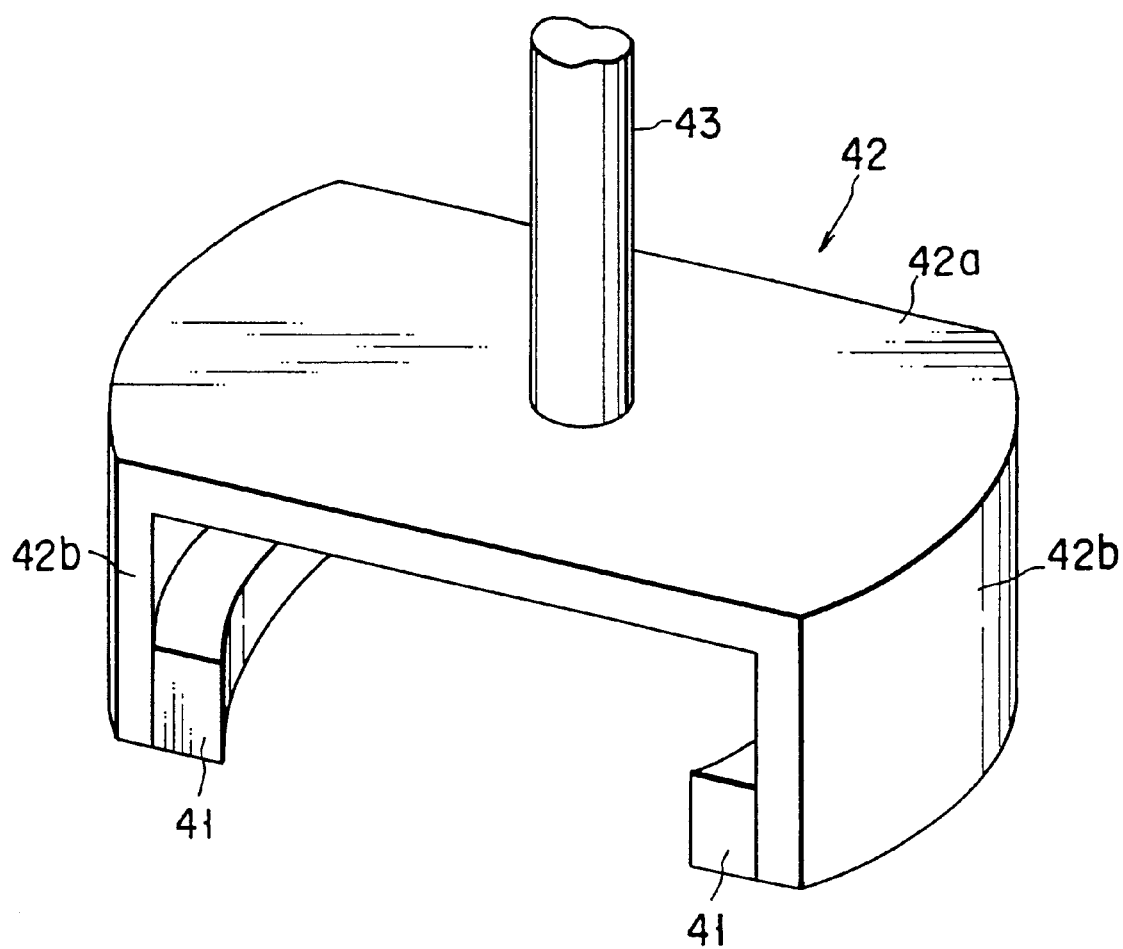
FIG. 3 is a perspective view showing the magnetic field generating section of the apparatus shown in FIG. 2.

A magnetic field generating section 40 is located above the process chamber 10. The section 40 comprises a pair of permanent magnets 41, a yoke 42 made of magnetic material such as soft iron and supporting the permanent magnets 41, a shaft 43 connected to the center of the upper surface of the yoke 42 and extending vertically, and an electric motor 44 for driving the shaft to rotate the permanent magnets 41. As is shown in FIG. 3, the yoke 42 has an upper plate 42a and two side plates 42b.

The upper plate 42a has arcuate ends. The side plates 42b are also arcuate and connected to, and extend downwards from, the ends of the upper plate 42a, respectively. The permanent magnets 41 are attached to the inner surfaces of the lower end portions of the side plates 42b, respectively.

As is shown in FIG. 2, an annular groove 33 is formed in the top of the upper part 10a of the chamber 10, surrounding the space between the upper electrode 11 and the lower electrode 12. The permanent magnets 41 are located within this annular groove 33 and rotated therein by means of the electric motor 44, along the rim of the space between the electrodes 11 and 12. Since the insulator 26 insulates the upper electrode 11 and the chamber 10 from each other, that portion of the plate defining the top of the chamber 10 which forms the bottom of the annular groove 33 does not operate as an electrode. It is desirable that the permanent magnets 41 be located as remote as possible from the upper plate 42a of the yoke 42, so as to reduce the vertical component of the magnetic field.

The bellows 32, which couple the parts 10a and 10b, enables the upper part 10a of the chamber 10 to move upwards to insert a semiconductor wafer 13 into chamber 10 and remove the same therefrom. More precisely, the upper part 10a is moved upwards by two cylinder mechanisms 45 arranged above the chamber 10, enabling a wafer 13 to be inserted into and removed from the chamber 10, not interrupted by that portion of the top of the chamber 10 which defines the annular groove 33. The motor 44 is connected to a cylinder mechanism 46 for moving motor 44 up and down. Hence, the magnetic field generating section 40 can be moved in the vertical direction, together with the upper part 10a of the process chamber 10.

Figure 4:
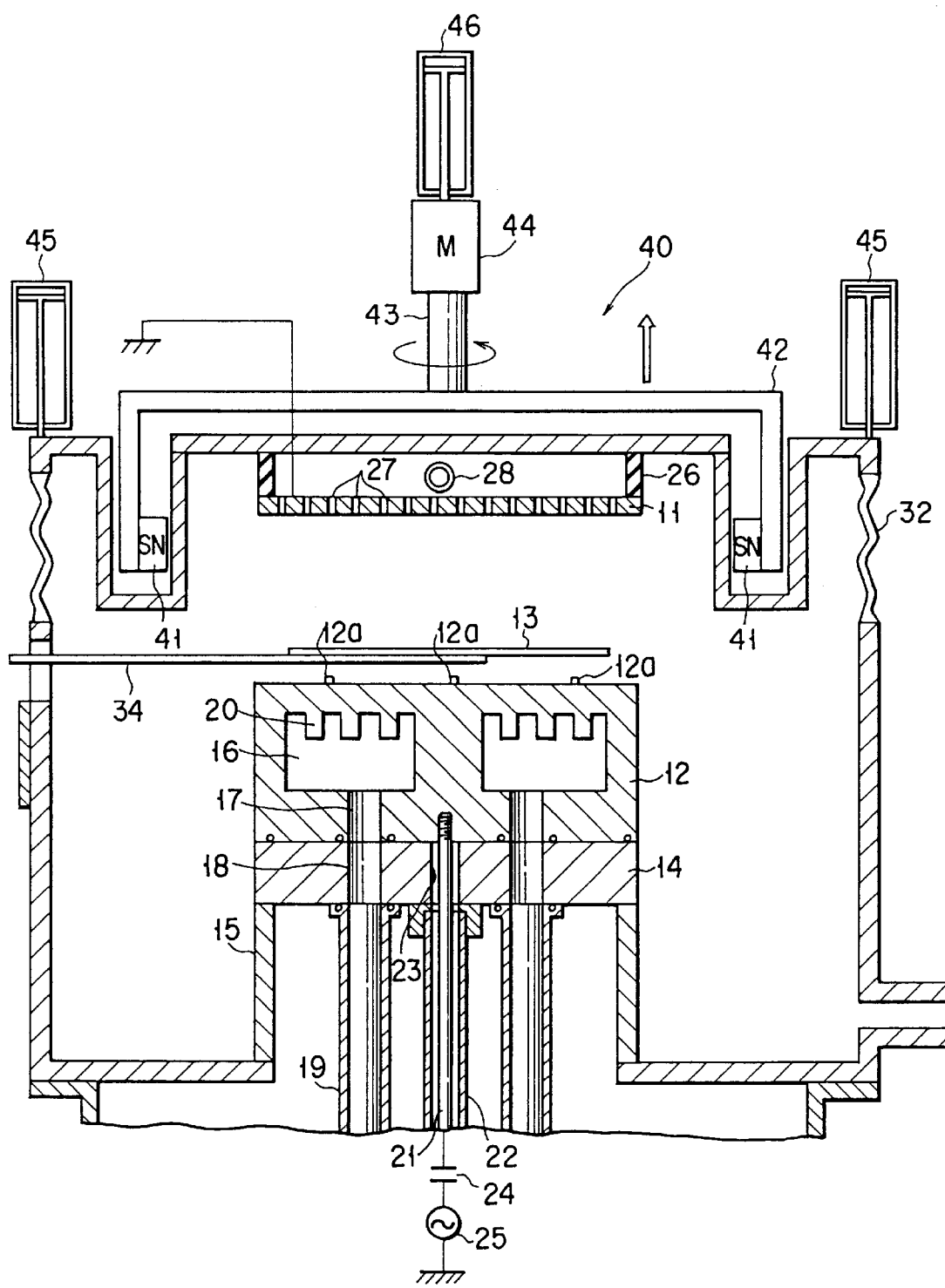
FIG. 4 is a cross-sectional view showing the state of transporting of a semiconducter wafer as an object to be processed.

In the magnetron plasma etching apparatus shown in FIGS. 2 to 4, the upper part 10a of the chamber 10 and the magnetic field generating section 40 are moved up as is shown in FIG. 4. The shutter 31 is slid down, opening the gate 30. A transport arm 34 holding a semi-conductor wafer 13 is moved into the chamber 10 through the gate 30. Three pins 12a are thrust upwards from the upper surface of the lower electrode 12 and come to hold the semiconductor wafer 13. The arm 34 is retreated out of the chamber 10, and the pins 12a are lowered. The wafer 13 is thereby placed on the upper electrode 13. The wafer 13 is secured to the electrode 13 by fastening means such as an electrostatic chuck.

Next, the shutter 31 is moved up, thus closing the gate 30. The upper part 10a of the chamber 10 and the magnetic field generating section 40 are lowered. The chamber 10 is evacuated by exhausting gases from the chamber 10 through the exhaust pipe 29. This done, the process gas, i.e., the etching gas, is introduced into the chamber 10 from the gas-supplying port 28 through the gas inlet holes 27.

In this condition, a radio-frequency power of 380 KHz or 13.56 MHz is supplied from the power supply 25 to the lower electrode 12. An electric field is generated in the space between the electrodes 11 and 12, which extends in the vertical direction. Plasma of the etching gas is thereby formed in said space. At the same time, the magnetic field generated by the permanent magnets 41 and extending in the horizontal direction is applied in the space. As a result, a closed electromagnetic field is formed in the space between the electrodes 11 and 12, whereby magnetron plasma etching is performed on the wafer 13 secured on the lower electrode 12. The closed electromagnetic field causes cycloidal motion of electrons. Hence, the electrons collide with the gas molecules at a higher frequency, raising the speed of etching the wafer 13. Since the permanent magnets 41 are located, surrounding the space between the electrodes 11 and 12, they generate a magnetic field which extends in a substantially horizontal direction, as is shown in FIG. 2, from one of the magnets 41 to the other of the magnets 41. This magnetic field has a very small vertical component at the wafer surface, and the difference among the self biases ($V_{DC}$) generated on the surface of the wafer 13 is reduced to substantially nil. It is therefore possible to uniformly etch the entire surface of the semiconductor wafer 13.

In the conventional magnetron plasma etching apparatus (FIG. 1), no yokes can be used since the permanent magnets are arranged above the chamber 10 as is shown in FIG. 1, and the fluxes emanating from these magnets are utilized. In the apparatus shown in FIGS. 2 and 3, a yoke can be and is used, supporting a pair of permanent magnets 41. This is because the permanent magnets 41 are located, surrounding the space between the upper electrode 11 and the lower electrode 12, and a magnetic field is generated which extends in a substantially horizontal direction, from one magnet to the other. The yoke 42 serves to minimize the adverse influence of leakage magnetic field. More specifically, since the fluxes of the magnetic field exist in a region having high magnetic permeability, those fluxes not extending horizontally pass through the yoke 41, minimizing a leakage magnetic field, if any.

According to the present invention, the lower part 10b of the process chamber 10 may be covered with a member made of magnetic material such as soft iron, thereby to reduce, still more, the influence a leakage magnetic field imposes on the chamber 10.

Since the permanent magnets 41 are located in the annular groove 33, the volume of the apparatus can be small.

After the wafer 13 has been etched, the upper part 10a of the chamber 10 and the magnetic field generating section 40 are moved upwards, and the shutter 31 is slid down, thus opening the gate 30. The fastening means (e.g., an electrostatic chuck) is deenergized so that the semiconductor wafer 13 may be lifted from the lower electrode 12. The pins 12a are thrust upwards from the upper surface of the lower electrode 12 and lift the wafer 13 form the electrode 12 and hold the wafer 13. The arm 34 is inserted into the chamber 10 through the gate 30 and positioned below the wafer 13. The pins 12a are lowered, whereby the wafer 13 is transferred onto the arm 34. The arm 43 is pulled out of the chamber 10 through the gate 30, thus transporting the wafer 13 from the chamber 10.

Figure 5:
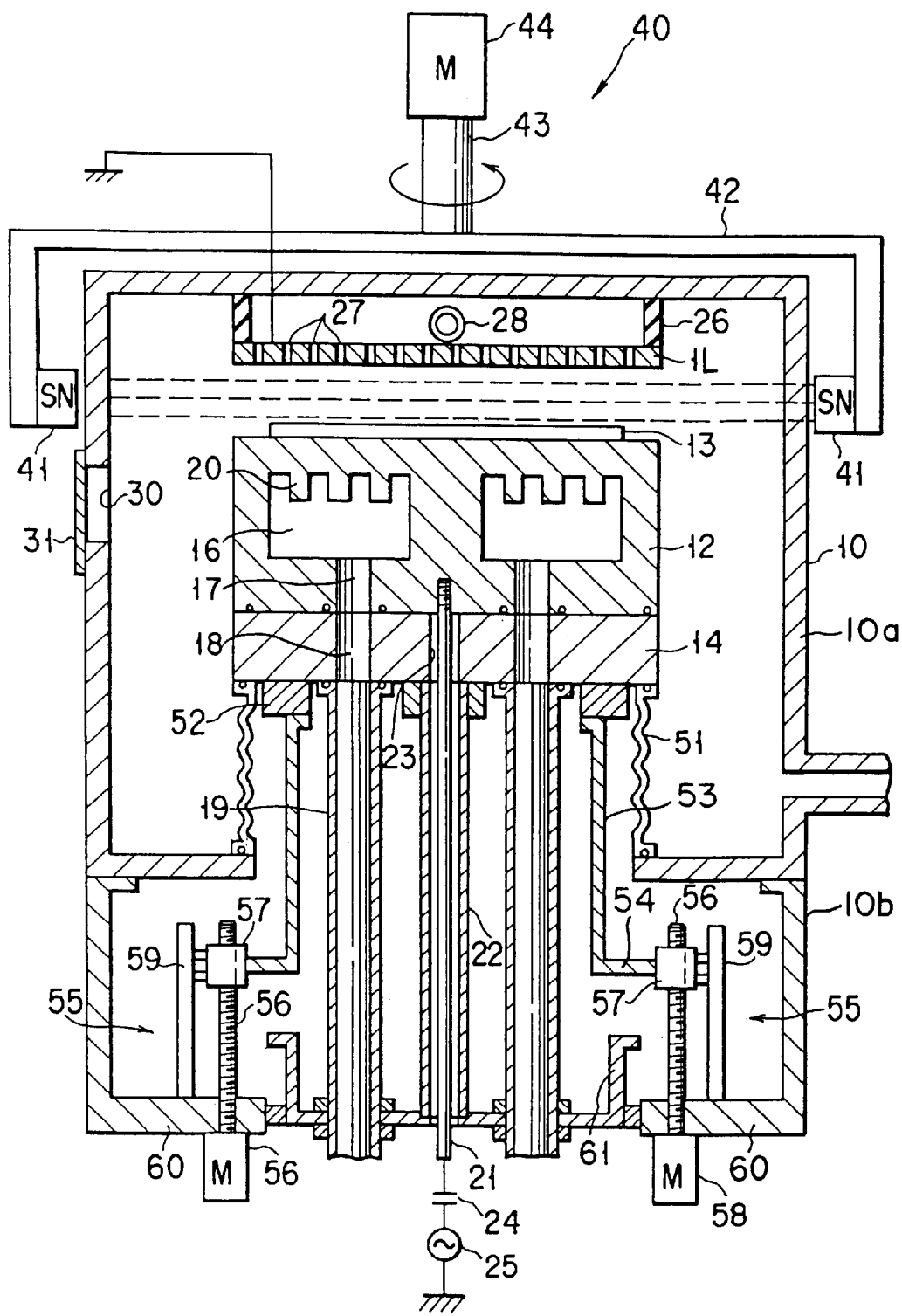
FIG. 5 is a cross-sectional view of a magnetron plasma etching apparatus according to a second embodiment of the invention.

With reference to FIG. 5, another magnetron plasma etching apparatus will be described which is a second embodiment of the present invention, with reference to FIG. 5. In FIG. 5, the components which are substantially identical in function to those shown in FIG. 2 are designated by the same reference numerals in FIG. 5 and will not be described in detail.

As is shown in FIG. 5, a bellows 51 is used in place of the hollow cylindrical support 15. The bellows 51 is interposed between, and attached to, a chamber 10 and a heat insulator 14. A connecting member 53, which is a hollow cylinder having a flange 54, is connected fastened to the lower surface of the heat insulator 14 by a member 52 having a thickness of about 50 mm. The member 52 and the connecting member 53 are made of, for example, aluminum.

Coupled to the connector 51 is a pair of lift mechanisms 55 for lifting and lowering the lower electrode 12. Each lift mechanism 55 comprises a ball screw 56, a lift member 57, an electric motor 58, and a guide member 59. The ball screw 56 extends vertically. The lift member 57 is attached to the flange 54 of the connecting member 53 and set in screw engagement with the ball screw 56. The motor 58 is connected to the ball screw 56, for rotating the same. Guided by the guide member 59, the lift member 57 can move up and down as the screw 56 is rotated by the motor 58, thereby to lift and lower the lower electrode 12.

A flange 60 is connected to the bottom of the process chamber 10. Fastened to the flange 59 are the motor 58 and guide member 59 of each lift mechanism 55. Two stoppers 61 are connected to the lower end of the flange 60. The stopper 61 for stopping the flange 54 of the connecting member 53 is provided below the connecting member 53.

In the apparatus of FIG. 5, a part of the chamber 10 need not be moved vertically to lift or lower the upper electrode 12 as in the magnetron plasma etching apparatus shown in FIGS. 2 to 4. This is because the lift mechanism 55 lowers the electrode 12 so that a semiconductor wafer may be inserted into the chamber 10 and removed therefrom, and lifts the electrode 12 to the position shown in FIG. 5 so that the wafer may be plasma-etched.

Since the upper part 10a of the chamber 10 need not be lifted or lowered at all, the top of the chamber 10 need not have an annular groove like the groove 33 of the first embodiment and permanent magnets 41 can be arranged outside the process chamber 10. In the apparatus of FIGS. 2 to 4, if the magnets 41 were arranged outside the chamber 10, the gate 30 and the bellows 32 would be located between the magnets 41 as the upper part 10b of the chamber 10 is lifted or lowered. However, the apparatus of FIG. 5 does not have such drawbacks.

Since the magnets 41 are located outside the chamber 10, the process chamber 10 can have a smaller diameter than its counterpart of the apparatus shown in FIGS. 2 to 4.

The apparatus of FIG. 5 can perform plasma etching in the same way as the apparatus shown in FIGS. 2 to 4.

The present invention is not limited to the embodiments described above. Rather, various changes and modification can be made without departing from the scope of the present invention. For instance, as is shown FIG. 6, the top 11a of a process chamber 10 can function as an upper electrode. In this case, the apparatus is more simple in structure than the apparatuses described above, and the chamber 10 can be smaller than those of the apparatuses described above. Since the top 11a of the chamber 10 is insulated by an insulator 26a from any other part of the chamber 10, any other part of the chamber 10 does not function as an electrode.

In the embodiments described above, it is the upper electrode 11 which works as cathode. Instead, the upper electrode 11 and the lower electrode 13 can be used as anode and cathode, respectively.

Further, cylinder mechanisms and screw mechanisms are used as lift mechanisms. According to this invention, mechanisms of any other type can be used as such.

Still further, the present invention can be applied, not only to a magnetron plasma etching apparatus, but also to other types of magnetron plasma process apparatuses such as a plasma CVD apparatus.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A magnetron plasma process apparatus comprising:

a process chamber having a transfer port for an object to be processed;

a first electrode horizontally extending within said process chamber and supporting said object to be processed;

a second electrode located within said process chamber and extending above said first electrode and parallel thereto;

gas-supplying means for supplying a process gas into a space between said electrodes;

electric field generating means for generating an electric field in the space between said electrodes, to thereby form plasma of the process gas;

magnetic field generating means having at least two permanent magnets located outside said process chamber, two of said permanent magnets being oppositely Positioned so as to sandwich the space between said electrodes, for generating a horizontal magnetic field which extends through the space between said electrodes, from one of said magnets to the other thereof and substantially parallel to said electrodes;

means for rotating said permanent magnets in a horizontal plane; and drive means for moving said first electrode in a vertical direction between a process position at which said object is located in said process chamber and within the horizontal magnetic field and a transfer position which is below said process position and at which said object is located on the same level as said transfer port which is located at a level lower than said two permanent magnets which sandwich the space between said electrodes, so as to move said object into and from said process chamber.

2. The magnetron plasma process apparatus according to claim 1, wherein said magnetic field generating means has a yoke supporting said permanent magnets and preventing a leakage magnetic field other than the magnetic field extending substantially parallel to said electrodes at the space between said electrodes.

3. The magnetron plasma process apparatus according to claim 1, further comprising transporting means for transporting the object between a position in which the object is applied to said magnetic field and another position outside of said process chamber.

* * * * *